US012568818B2

(12) United States Patent
Kim et al.

(10) Patent No.: US 12,568,818 B2
(45) Date of Patent: Mar. 3, 2026

(54) CAPACITOR COMPONENT AND SEMICONDUCTOR PACKAGE INCLUDING CAPACITOR COMPONENT

(71) Applicant: SAMSUNG ELECTRO-MECHANICS CO., LTD., Suwon-si (KR)

(72) Inventors: Jae Hoon Kim, Suwon-si (KR); Hye Jin Kim, Suwon-si (KR); Gyoung Heon Ko, Suwon-si (KR); Jang Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 430 days.

(21) Appl. No.: 18/214,102

(22) Filed: Jun. 26, 2023

(65) Prior Publication Data

US 2024/0222263 A1 Jul. 4, 2024

(30) Foreign Application Priority Data

Dec. 28, 2022 (KR) ........................ 10-2022-0187403

(51) Int. Cl.
| | |
|---|---|
| *H01L 23/522* | (2006.01) |
| *H01L 23/00* | (2006.01) |
| *H01L 23/498* | (2006.01) |
| *H10D 1/68* | (2025.01) |

(52) U.S. Cl.
CPC .... *H01L 23/5223* (2013.01); *H01L 23/49822* (2013.01); *H01L 24/32* (2013.01); *H10D 1/684* (2025.01); *H10D 1/696* (2025.01); *H10D 1/716* (2025.01); *H01L 2224/32104* (2013.01); *H01L 2224/32146* (2013.01); *H01L 2924/1205* (2013.01); *H01L 2924/19041* (2013.01)

(58) Field of Classification Search
CPC ........... H01L 23/5223; H01L 23/49822; H01L 24/32; H01L 2224/32104; H01L 2224/32146; H01L 2924/1205; H10D 1/684; H10D 1/696; H10D 1/716
See application file for complete search history.

(56) References Cited

U.S. PATENT DOCUMENTS 8,912,522 B2    12/2014    Rubloff et al.
2020/0219656 A1    7/2020    Tiguchi et al.

FOREIGN PATENT DOCUMENTS

JP        WO2019/171750 A1    9/2019

*Primary Examiner* — Samuel A Gebremariam
(74) *Attorney, Agent, or Firm* — MORGAN, LEWIS & BOCKIUS LLP

(57) ABSTRACT

A capacitor component includes a support member; capacitance laminates laminated on one surface of the support member; at least one insulating layer disposed between the capacitance laminates; and a plurality of through structures each penetrating through at least one of the capacitance laminates. Each of the capacitance laminates includes a first electrode layer, a second electrode layer, and a dielectric layer disposed between the first and second electrode layers. One of the plurality of through structures includes a connection conductive pillar connected between first electrode layers of the capacitance laminates. Another of the plurality of through structures includes a first conductive pillar connected to a first electrode layer of one of the capacitance laminates, a dielectric through portion surrounding the first conductive pillar; and a through connection portion surrounding the dielectric through portion and connecting second electrode layers of the capacitance laminates to each other.

25 Claims, 15 Drawing Sheets

<u>100a-1</u>

<u>100a-2</u>

100a-3

100a-4

121a    111b 111a 122a 122b    100a-7

116

134

117

118

121a    111b 111a 122a 122b    100a-8

116

134

117

118

CAPACITOR COMPONENT AND SEMICONDUCTOR PACKAGE INCLUDING CAPACITOR COMPONENT

CROSS-REFERENCE TO RELATED APPLICATION (S)

This application claims benefit of priority to Korean Patent Application No. 10-2022-0187403 filed on Dec. 28, 2022 in the Korean Intellectual Property Office, the disclosure of which is incorporated herein by reference in its entirety.

TECHNICAL FIELD

The present disclosure relates to a capacitor component and a semiconductor package including a capacitor component.

BACKGROUND

In electronic devices such as a smartphone, a personal digital assistant, a digital video camera, a digital still camera, a network system, a computer, a monitor, a tablet, a laptop, a netbook, a television, a video game, a smartwatch, an automotive component, and the like, capacitor components providing capacitance may be used.

Important performance among performances of capacitor components may be equivalent series inductance (ESL), capacitance for unit volume, and thin thickness for unit capacitance.

A multilayer ceramic capacitor (MLCC) may use a material having a high dielectric constant of a perovskite structure as a dielectric, and a structure in which a plurality of repeatedly deposited dielectric layers may be connected to each other in parallel, a distance between electrodes may be decreased, and a thickness of the dielectric layer may be reduced, such that capacitance may be effectively increased. However, an MLCC may have limitations in lowering ESL or reducing the thickness thereof.

Types of capacitor components other than an MLCC may be advantageous in lowering ESL or reducing thickness, but it may be difficult to secure capacitance increasing efficiency.

SUMMARY

An example embodiment of the present disclosure is to provide a capacitor component and a semiconductor package including a capacitor component which may be advantageous in reducing ESL or a reduced thickness as compared to MLCC, and also may gain efficiency in increasing capacitance (not referring to relative efficiency with respect to MLCC).

According to an example embodiment of the present disclosure, a capacitor component includes a support member; a plurality of capacitance laminates laminated on one surface of the support member; at least one insulating layer disposed between the plurality of capacitance laminates; and a plurality of through structures each penetrating through at least one of the plurality of capacitance laminates. Each of the plurality of capacitance laminates includes a first electrode layer, a second electrode layer, and a dielectric layer disposed between the first and second electrode layers. One of the plurality of through structures includes a connection conductive pillar connected between first electrode layers of the plurality of capacitance laminates. Another of the plurality of through structures includes a first conductive pillar connected to a first electrode layer of one of the plurality of capacitance laminates, a dielectric through portion surrounding the first conductive pillar; and a through connection portion surrounding the dielectric through portion and connecting second electrode layers of the plurality of capacitance laminates to each other.

According to an example embodiment of the present disclosure, a semiconductor package includes a semiconductor chip; a redistribution structure including a redistribution connected to the semiconductor chip; and the capacitor component connected to the semiconductor chip and disposed on the redistribution structure.

According to an example embodiment of the present disclosure, a capacitor component includes a support member; a first capacitance region disposed on the support member and including a first electrode layer, a first dielectric layer, and a second electrode layer; a second capacitance region disposed on the support member to at least partially overlap with the first capacitance region in a thickness direction of the support member, and including a third electrode layer, a second dielectric layer, and a fourth electrode layer; an insulating layer disposed between the second electrode layer and the third electrode layer; first and second through structures each penetrating through the insulating layer; a first extension portion disposed in the first through structure to connect the first electrode layer and the third electrode layer to each other; and a second extension portion disposed in the second through structure to connect the second electrode layer and the fourth electrode layer to each other.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Figure 1:
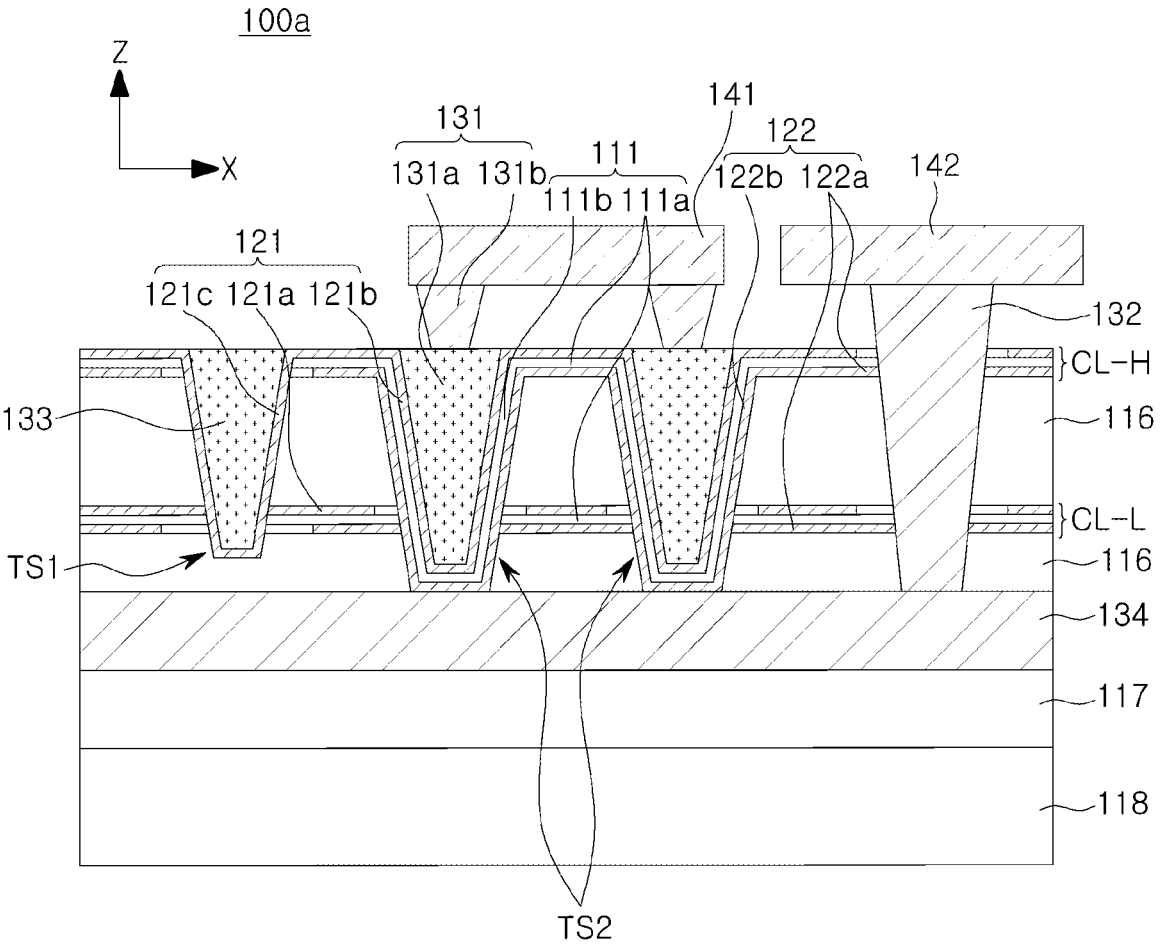
FIG. 1 is a diagram illustrating a capacitor component according to an example embodiment of the present disclosure, viewed laterally.

Hereinafter, embodiments of the present disclosure will be described as below with reference to the accompanying drawings.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application.

Referring to FIGS. 1 to 4B, the capacitor component 100a in an example embodiment may have a structure in which a first electrode portion 121, a dielectric part 111, and a second electrode portion 122 form capacitance. The dielectric portion 111 may include a dielectric layer 111a and a dielectric through portion 111b, the first electrode portion 121 may include the first electrode layer 121a and/or a plurality of through extension portions 121b and 121c, and the second electrode portion 122 may include a second electrode layer 122a and a through connection portion 122b. The first electrode portion 121 may correspond to a (+) terminal, and the second electrode portion 122 may correspond to a (−) terminal.

Referring to FIGS. 1 to 4B, the capacitor component 100a in an example embodiment may include a support member 118, a plurality of capacitance laminates CL-H and CL-L, at least one insulating layer 116, and a plurality of through structures TS1 and TS2. Each of the plurality of capacitance laminates CL-H and CL-L may include a first electrode layer 121a, a second electrode layer 122a, and a dielectric layer 111a disposed between the first and second electrode layers 121a and 122a. One of the plurality of through structures TS1 may include a connection conductive pillar 133, and the other of the plurality of through structures TS2 may include a through connection portion 122b, a dielectric through portion 111b, and a first conductive pillar 131a.

The support member 118 may include at least a portion of a silicon wafer. For example, the support member 118 may be formed by dicing or grinding a portion of a silicon wafer. Since the thickness of the support member 118 (in the Z-direction) may occupy more than half of the total thickness of the capacitor component 100a (in the Z-direction), the overall thickness of the capacitor component 100a may be adjusted by adjusting the thickness of the support member 118. For example, the total thickness of the capacitor component 100a may be less than 100 μm, and the thickness of the support member 118 may be less than 90 μm. For example, the total thickness of the capacitor component 100a may be less than 70 μm, and the thickness of the support member 118 may be less than 60 μm.

The horizontal size of the capacitor component 100a in an example embodiment may be similar to the horizontal size of the MLCC (e.g., 1205 size with a length of 1.2 mm (in the X-direction) and a width of 0.5 mm (in the Y-direction). MLCC may not be efficient to have a thickness of less than 100 μm, but since it may be relatively easy to reduce the thickness of the support member 118 in the capacitor component 100a in the example embodiment, the capacitor component 100a may have a structure advantageous to be reduced to a thickness of less than 100 μm.

The second electrode layer 122a, the dielectric layer 111a, and the first electrode layer 121a of each of the plurality of capacitance laminates CL-H and CL-L may be laminated on one surface of the support member 118, and may form capacitance in the lamination direction (e.g., Z-direction). An area of a surface (e.g., an X-Y plane) perpendicular to the lamination direction of the second electrode layer 122a, the dielectric layer 111a, and the first electrode layer 121a may be proportional to capacitance. The number of the plurality of capacitance laminates CL-H and CL-L may also be proportional to the total capacitance of the plurality of capacitance laminates CL-H and CL-L.

Since the capacitor component 100a in an example embodiment may have a structure advantageous for increasing the total number of a plurality of capacitance laminates CL-H and CL-L, capacitance increase efficiency may increase.

For example, the dielectric layer 111a and the first and second electrode layers 121a and 122a of each of the plurality of capacitance laminates CL-H and CL-L may be formed as much as a reduced thickness through an atomic layer deposition (ALD) process or an atomic vapor deposition (AVD) process. Accordingly, the number of the plurality of capacitance laminates CL-H and CL-L may not have a significant effect on the overall thickness of the capacitor component 100a. A process of forming a plurality of capacitance laminates CL-H and CL-L is not limited to an ALD process or an AVD process, and may include, for example, a portion of processes of a memory semiconductor process.

For example, the first and second electrode layers 121a and 122a of each of the plurality of capacitance laminates CL-H and CL-L may include at least one of the metals with high conductivity (e.g., Ni, Cu, Pd, Ag, Pb, and Pt), or may include materials advantageous to be formed to have a significantly reduced thin thickness (e.g., nitrides of one of Ti, Co, Nb, and Sn).

For example, each dielectric layer 111a of a plurality of capacitance laminates CL-H and CL-L may include at least one of $SiO_2$, $Si_3N_4$, $Al_2O_3$, $AlO_2$, $ZrO_2$, $HfO_2$, $Nb_2O_5$, $CeO_2$ and $TiO_2$. The dielectric layer 111a may have a lower dielectric constant than that of a ferroelectric such as barium titanate ($BaTiO_3$), and may be advantageously formed to have a further reduced thickness than that of a dielectric layer including a ferroelectric such as barium titanate ($BaTiO_3$). As the thickness of the dielectric layer 111a is reduced, the distance between the first electrode layer 121a and the second electrode layer 122a may be shortened, and capacitance of each of the plurality of capacitance laminates CL-H and CL-L may increase.

At least one insulating layer 116 may be disposed between the plurality of capacitance laminates CL-H and CL-L. The at least one insulating layer 116 may improve electrical isolation between the second electrode layer 122a of one of the plurality of capacitance laminates CL-H and the first electrode layer 121a of the other one of the plurality of capacitance laminates CL-L, and may improve efficiency of the electrical path of a current flowing through the first and second electrode layers 121a and 122a. Accordingly, the capacitor component 100a in an example embodiment may be advantageous in reducing ESL. For example, the ESL of the MLCC may be about 100 pH, and the ESL of the capacitor component 100a may be less than 5 pH.

For example, when the number of the plurality of capacitance laminates CL-H and CL-L is three or more, the insulating layer 116 may include a plurality of insulating layers 116 spaced apart from each other by the plurality of capacitance laminates CL-H and CL-L. The thickness of each of the plurality of insulating layers 116 may be greater than the thickness of each of the plurality of capacitance laminates (the sum of the thicknesses of the dielectric layer 111a and the first and second electrode layers 121a and 122a). For example, a thickness of each of the plurality of insulating layers 116 may be 0.1 μm or more and less than or equal to 0.2 μm, and a thickness of each of the plurality of through structures TS1 and TS2 may be 20 nm or less, but an example embodiment thereof is not limited thereto. Each of the plurality of insulating layers 116 may be a support for a plurality of capacitance laminates CL-H and CL-L and may include SiO₂, but an example embodiment thereof is not limited thereto.

The connection conductive pillar 133 included in one of the plurality of through structures TS1 may penetrate through at least one dielectric layer 111a of the plurality of capacitance laminates CL-H and CL-L and the first and second electrode layers 121a and 122a and may be electrically connected between the first electrode layers 121a of the plurality of capacitance laminates CL-H and CL-L. The connection conductive pillar 133 may penetrate through one of the plurality of insulating layers 116.

The first conductive pillar 131a included in the other of the plurality of through structures TS2 may penetrate through at least one dielectric layer 111a of the plurality of capacitance laminates CL-H and CL-L and the first and second electrode layers 121a and 122a, and may be electrically connected to one of the first electrode layers 121a of the plurality of capacitance laminates CL-H and CL-L. The dielectric through portion 111b included in the other of the plurality of through structures TS2 may surround the first conductive pillar 131a. The through connection portion 122b included in the other of the plurality of through structures TS2 may surround the dielectric through portion 111b, and may electrically connect the second electrode layers 122a of the plurality of capacitance laminates CL-H and CL-L to each other.

Since the through connection portion 122b, the dielectric through portion 111b, and the first conductive pillar 131a included in the other of the plurality of through structures TS2 may have a metal insulator metal (MIM) structure, thereby horizontally forming capacitance. Since the through connection portion 122b electrically connects the plurality of second electrode layers 122a to each other, vertical depths of the through connection portion 122b, the dielectric through portion 111b, and the first conductive pillar 131a may be sufficiently deep. Accordingly, capacitance formed by the through connection portion 122b, the dielectric through portion 111b, and the first conductive pillar 131a may be efficiently increased.

Also, since the through connection portion 122b electrically connects the plurality of second electrode layers 122a to each other and the connection conductive pillar 133 electrically connects the plurality of first electrode layers 121a to each other, the through connection portion 122b and the connection conductive pillar 133 may allow the relationship between capacitances formed by each of the plurality of capacitance laminates CL-H and CL-L and the other one of the plurality of through structures TS2 closer to a parallel relationship in terms of circuitry, and may effectively integrate the capacitances.

For example, the number of first conductive pillars 131a (e.g., 2 in FIG. 1) may be two or more, and may be greater than the number (e.g., 1 in FIG. 1) of connection conductive pillars 133. The number of first conductive pillars 131a may be proportional to the total capacitance horizontally formed by the combination structure of the through connection portion 122b, the dielectric through portion 111b, and the first conductive pillar 131a. Since the capacitor component 100a in an example embodiment may be advantageous in implementing a narrow diameter (e.g., 0.1 μm or more and 0.2 μm or less) of the first conductive pillar 131a, it may be advantageous to increase the number of first conductive pillars 131a, and capacitance formed horizontally may be effectively increased.

For example, each of the first conductive pillar 131a and the connection conductive pillar 133 may include one or more materials selected from among materials included in the first and second electrode layers 121a and 122a, and may include TiN having fluidity during formation, but an example embodiment thereof is not limited thereto.

For example, the dielectric layer 111a of one of the plurality of capacitance laminates CL-H may be formed simultaneously with the dielectric through portion 111b and may be integrated with the dielectric through portion 111b. For example, the second electrode layer 122a of one of the plurality of capacitance laminates CL-H may be formed simultaneously with the through connection portion 122b and may be integrated with the through connection portion 122b. For example, the first electrode layer 121a of one of the plurality of capacitance laminates CL-H may be of through simultaneously formed with the plurality extension portions 121b and 121c, and may be integrated with the plurality of through extension portions 121b and 121c.

The plurality of through extension portions 121b and 121c may extend from the first electrode layer 121a of one of the plurality of capacitance laminates CL-H, may surround the connection conductive pillar 133 and may surround the first conductive pillar 131a. One of the plurality of through extension portions 121b may electrically connect the first electrode layers 121a of the plurality of capacitance laminates CL-H and CL-L to each other, and the other of the plurality of through extension portions 121c may be surrounded by a dielectric through portion 111b.

Referring to FIG. 1, a capacitor component 100a in an example embodiment further may include at least one of a second conductive pillar 132, a connection layer 134, and an additional insulating layer 117.

The second conductive pillar 132 may penetrate through one or more of the dielectric layer 111a and the first and second electrode layers 121a and 122a, and may be electrically connected between the second electrode layers 122a of the plurality of capacitance laminates CL-H and CL-L.

The connection layer 134 may be disposed between the second electrode layer 122a the most adjacent to the support member 118 among the second electrode layers 122a of the plurality of capacitance laminates CL-H and CL-L and the support member 118, and may be electrically connected between the through connection portion 122b and the second conductive pillar 132.

Accordingly, the relationship between the capacitances formed in the portions of the capacitor component 100a may become parallel, such that the capacitances may be efficiently integrated.

For example, the lower portion of the through connection portion 122b may be connected to the connection layer 134, and the lower portion of the plurality of through extension portions 121b and 121c may be spaced apart from the connection layer 134. Accordingly, the penetration depth of the connection conductive pillar 133 may be shorter than the penetration depth of the first conductive pillar 131a.

Conductivity of the first conductive pillar 131a may be lower than that of the second conductive pillar 132 and lower than that of the connection layer 134. The proportion of the second conductive pillar 132 and the connection layer 134 in the current path of the capacitor component 100a may be relatively large, and since the second conductive pillar 132 and the connection layer 134 may have high conductivity, overall energy loss of the capacitor component 100a may be effectively reduced. For example, the first conductive pillar 131a may include TiN, and each of the second conductive pillar 132 and the connection layer 134 may include copper (Cu).

An additional insulating layer 117 may be disposed between the connection layer 134 and the support member 118. For example, each of the additional insulating layer 117 and at least one insulating layer 116 may include $SiO_2$, and the insulating layer 116 and the additional insulating layer 117 disposed most adjacent to the connection layer 134 may be disposed with the connection layer 134 interposed therebetween.

Referring to FIG. 1, a capacitor component 100a in an example embodiment may include at least one of a first lead-out portion 131b, a first terminal 141, and a second terminal 142.

The first terminal 141 may be electrically connected to the first electrode layer 121a of the plurality of capacitance laminates CL-H and CL-L, and the second terminal 142 may be electrically connected to the second electrode layer 122a of the plurality of capacitance laminates CL-H and CL-L. For example, the first and second terminals 141 and 142 may be implemented as bumps or pads, and may be connected to an external wiring or component to provide capacitance formed by the capacitor component 100a to the outside of the capacitor component 100a.

The first lead-out portion 131b may be electrically connected between the first electrode layer 121a of the plurality of capacitance laminates CL-H and CL-L and may have conductivity higher than the first conductive pillar 131a and the connection conductive pillar 133. Accordingly, an electrical bottleneck phenomenon when the capacitance formed by the capacitor component 100a is supplied to the outside may be prevented. For example, the first lead-out portion 131b may include copper (Cu).

For example, the first lead-out portion 131b may be disposed to overlap the first conductive pillar 131a in a penetration direction (e.g., Z-direction) of the first conductive pillar 131a. Accordingly, an electrical bottleneck phenomenon when the capacitance formed by the capacitor component 100a is supplied to the outside may be prevented.

The second conductive pillar 132 may be electrically connected to the second terminal 142. Accordingly, the height of the combination structure 131 of the first conductive pillar 131a and the first lead-out portion 131b may be substantially the same as that of the second conductive pillar 132, and the second conductive pillar 132 may have a height higher than the first conductive pillar 131a, but an example embodiment thereof is not limited thereto.

Figure 2:
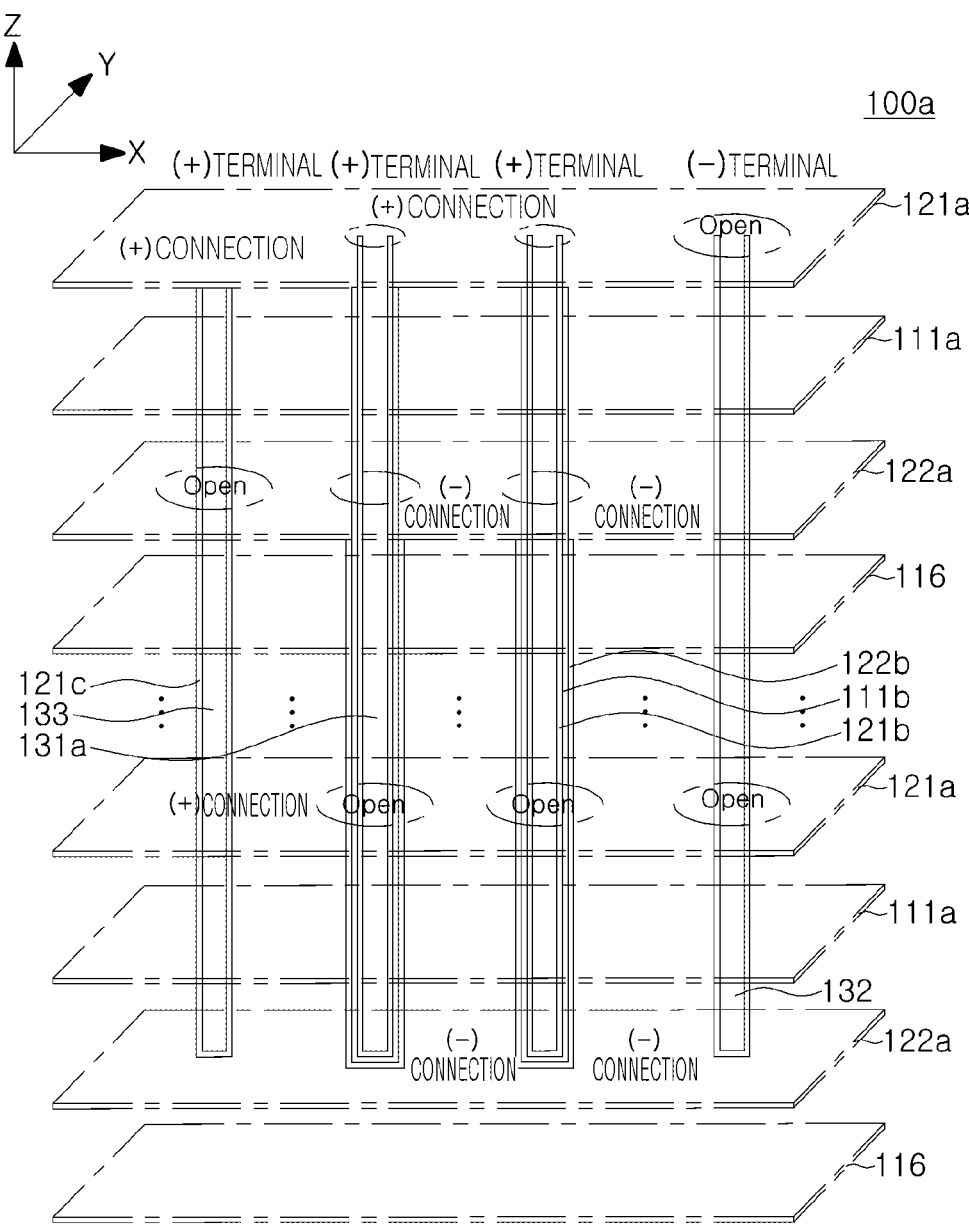
FIG. 2 is a perspective diagram illustrating electrical connection of capacitor components according to an example embodiment of the present disclosure.
Figure 3A:
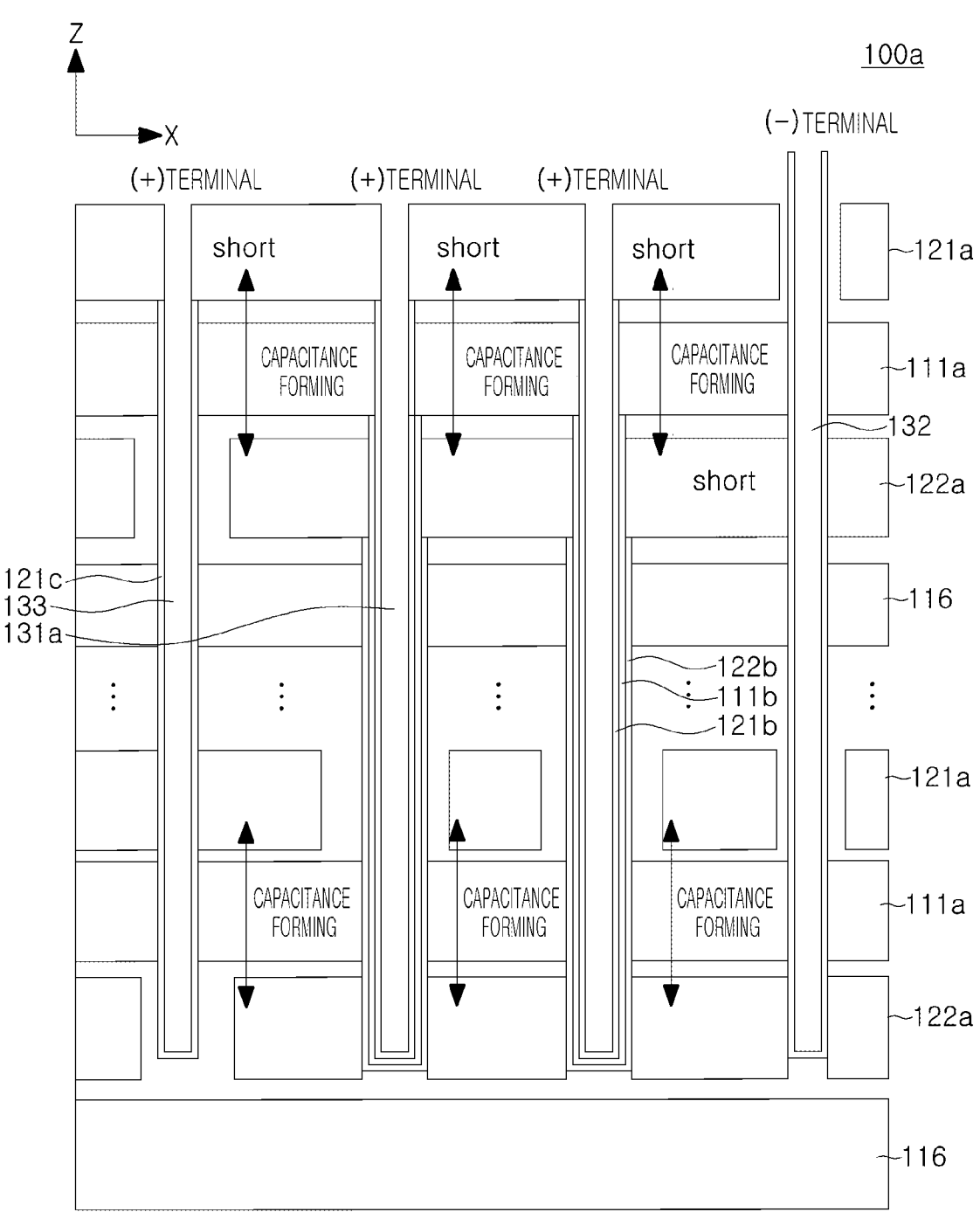
FIGS. 3A and 3B are diagrams illustrating capacitance forming of capacitance laminates of a capacitor component according to an example embodiment of the present disclosure.
Figure 3B:
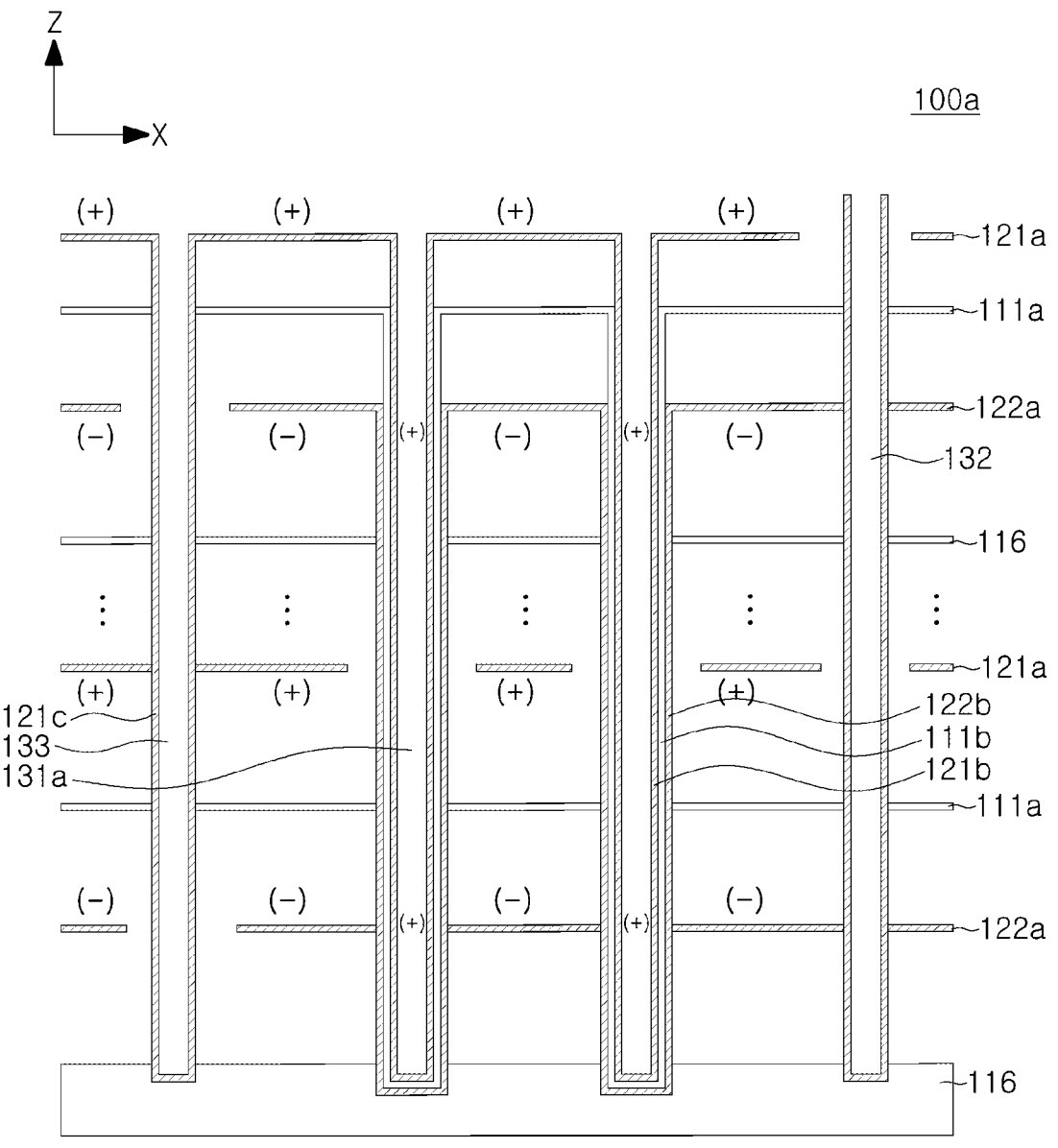
Figure 4A:
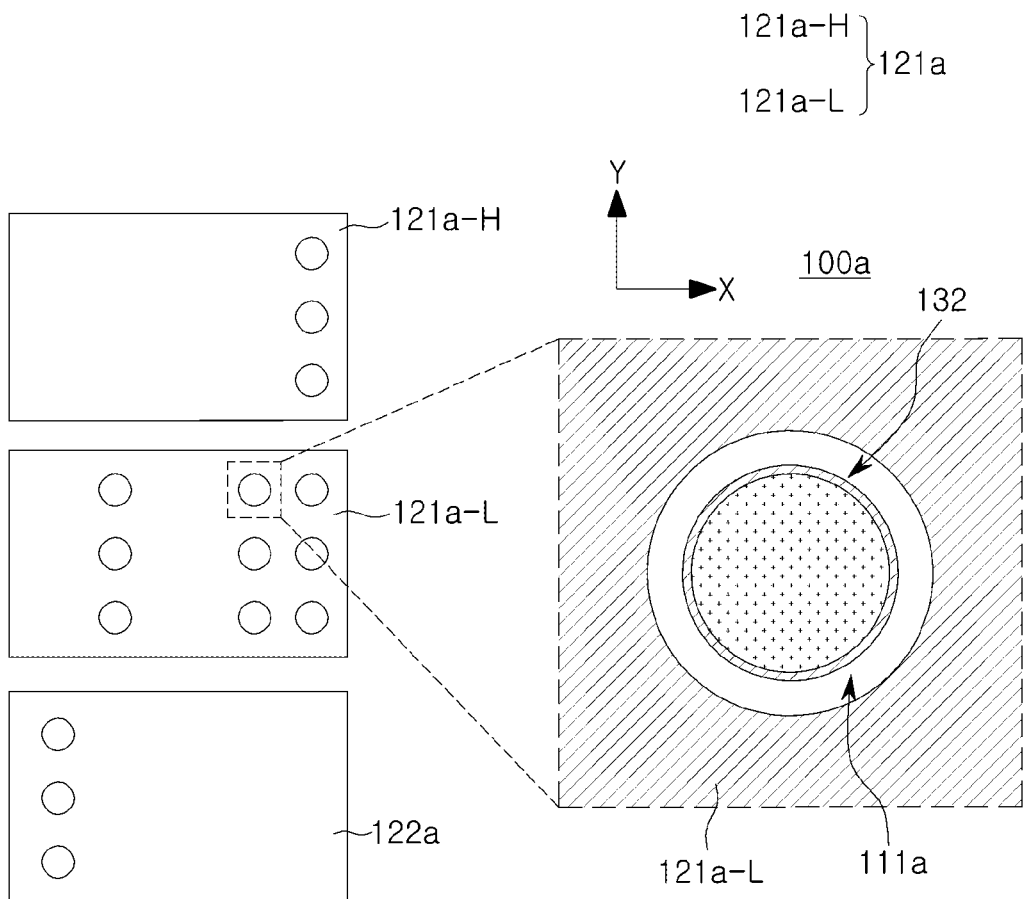
FIGS. 4A and 4B are plan diagrams illustrating arrangement of a plurality of through structures in capacitance laminates of a capacitor component according to an example embodiment of the present disclosure.

Referring to FIGS. 2 and 4A, among the plurality of first electrode layers 121a, the upper first electrode layer 121a-H may include an opening having a diameter larger than that of the second conductive pillar 132 so as not to be in contact with the second conductive pillar 132, the first electrode layer 121a-L of the lower portion among the plurality of first electrode layers 121a may include an opening having a diameter greater than that of the second conductive pillar 132 and greater than that of the through connection portion 122b so as not to be in contact with the second conductive pillar 132 and the through connection portion 122b, and the second electrode layer 122a disposed between the plurality of first electrode layers 121a may include an opening having a diameter larger than the diameter of the through extension portion 121c so as not to be in contact with the through extension portion 121c.

Figure 4B:
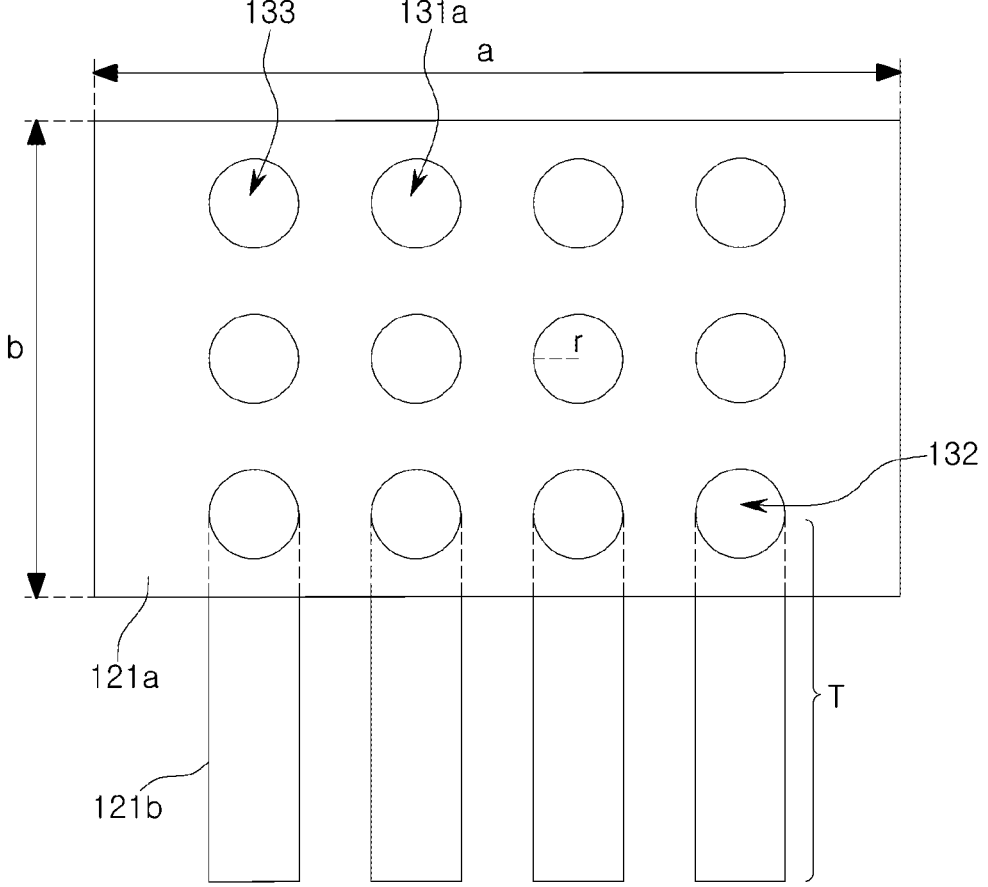

Referring to FIG. 4B, the first area not overlapping the first and second conductive pillars 131a and 132 and the connection conductive pillar 133 in the first electrode layer 121a may be a value obtained by subtracting a second area overlapping the first and second conductive pillars 131a and 132 and the connection conductive pillar 133 from a product of lengths a and b of the first electrode layer 121a in the first and second directions perpendicular to each other, and may be the area forming capacitance. The capacitance formed by the first area may be proportional to the total number of the plurality of capacitance laminates.

The second area overlapping the first and second conductive pillars 131a and 132 and the connection conductive pillar 133 may be obtained by multiplying the square of the average radius r of the first and second conductive pillars 131a and 132 and the connection conductive pillar 133 by the circumference and multiplying the total number of the first and second conductive pillars 131a and 132 and the connection conductive pillars 133, and may be the area forming capacitance. The capacitance formed by the second area may be independent of the total number of the plurality of capacitance laminates. For example, the average radius r may be about 0.1 μm.

The total circumference of the first and second conductive pillars 131a and 132 and the connection conductive pillar 133 may be obtained by multiplying the average radius r by 2 and multiplying the total number of the first and second conductive pillars 131a and 132 and the connection conductive pillars 133. The third area horizontally forming capacitance may be a value obtained by multiplying the total circumference by the average depth T of the first and second conductive pillars 131a and 132 and the connection conductive pillar 133, and may be an area forming capacitance. Since the average depth T may increase as the total number of the plurality of the capacitance laminates increases, capacitance formed by the third area may be affected by the total number of the plurality of capacitance laminates. For example, the average depth T may be about 2 μm.

Since the capacitor component in an example embodiment may have a structure advantageous for increasing the number of a plurality of capacitance laminates without significantly increasing the total thickness, the first area and the third area may be efficiently expanded, and a large capacitance may be formed without significantly increasing the total thickness.

Referring to FIGS. 5A to 5F, the capacitor component in an example embodiment may be manufactured by performing in order a first process 100a-1, a second process 100a-2, a third process 100a-3, a fourth process 100a-4, a fifth process 100a-5, a sixth process 100a-6, a seventh process 100a-7, an eighth process 100a-8, a ninth process 100a-9, a tenth process 100a-10, an eleventh process 100a-11, and a twelfth process 100a-12, but an example embodiment thereof is not limited thereto.

Figure 5A:
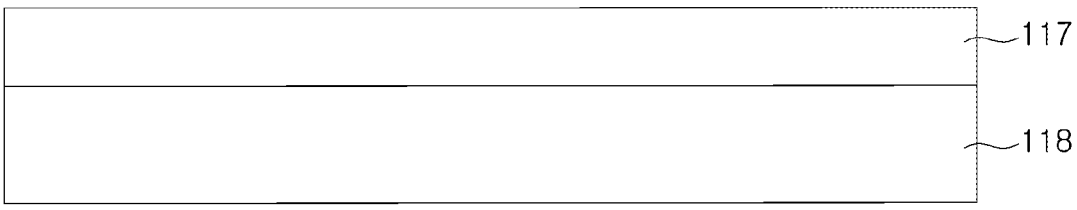
FIGS. 5A to 5F are diagrams illustrating a method of manufacturing a capacitor component according to an example embodiment of the present disclosure, viewed laterally.
Figure 5A:
Figure 5A:
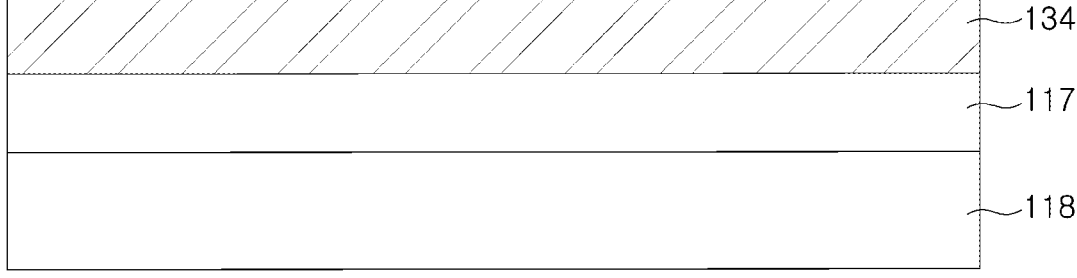

Referring to FIG. 5A, the first process 100a-1 may include forming an additional insulating layer 117 on one surface of the support member 118, and the second process 100a-2 may include forming the connection layer 134 on one surface of the additional insulating layer 117.

Figure 5B:
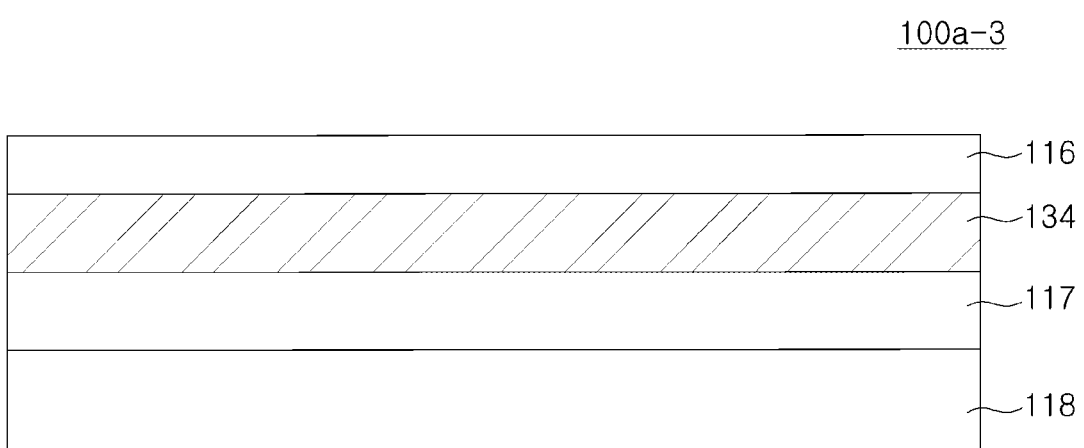
Figure 5B:
Figure 5B:
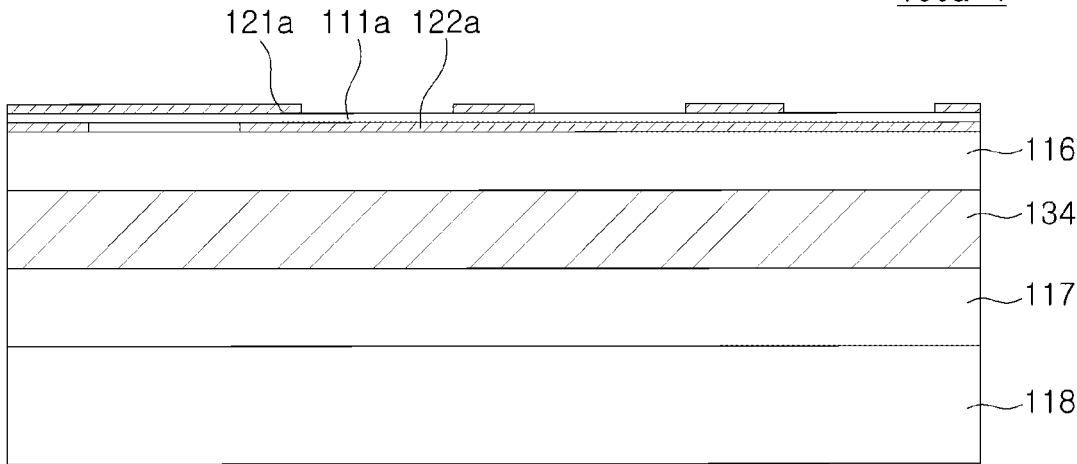

Referring to FIG. 5B, the third process 100a-3 may include forming an insulating layer 116 on one surface of the connection layer 134, and the fourth process 100a-4 may include forming the second electrode layer 122a, the dielectric layer 111*a*, and the first electrode layer 121*a* in order on one surface of the insulating layer 116.

Figure 5C:
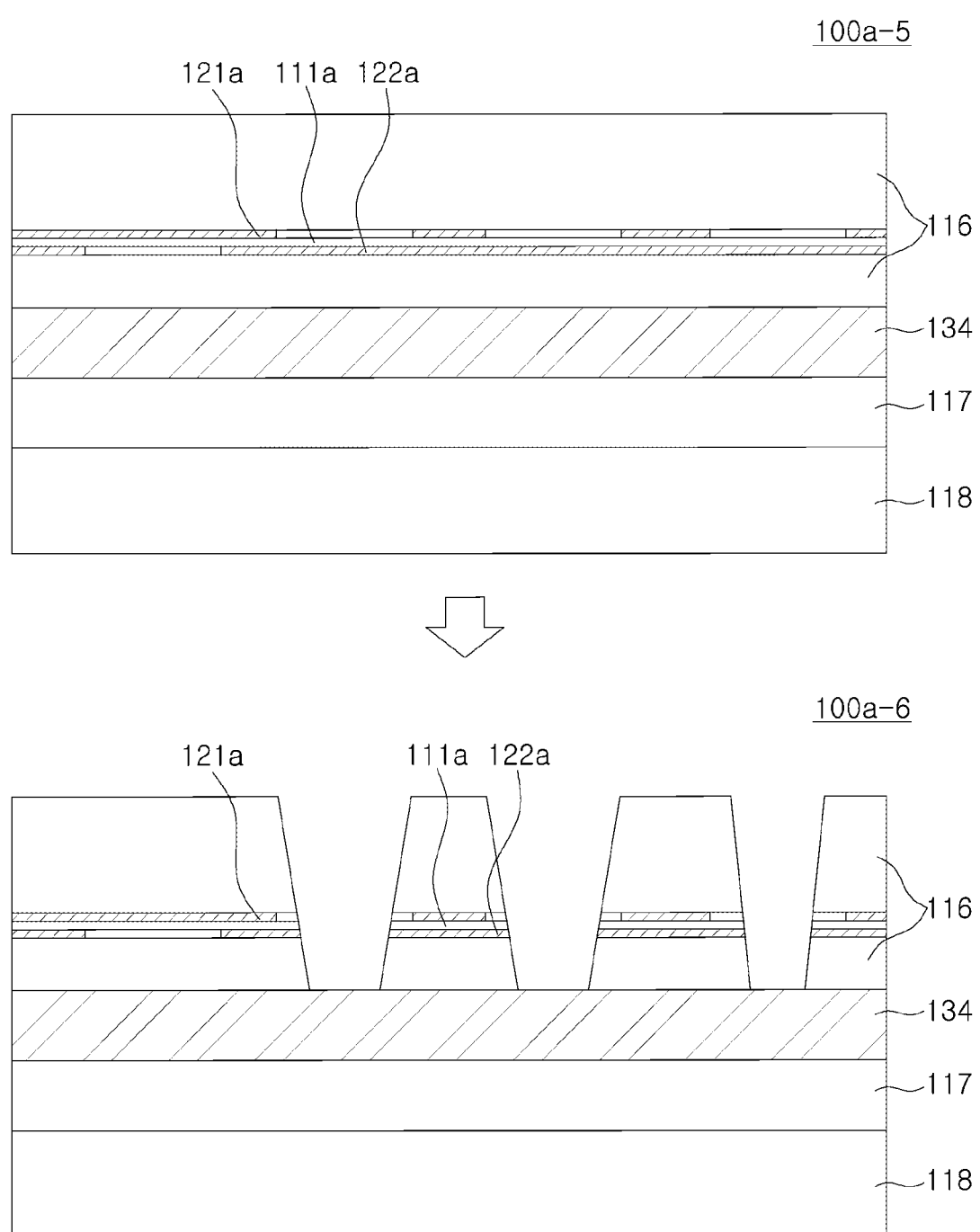

Referring to FIG. 5C, the fifth process 100*a*-5 may include forming an insulating layer 116 on one surface of the first electrode layer 121*a*, and the sixth process 100*a*-6 may include forming a through hole penetrating through the insulating layer 116, the second electrode layer 122*a*, the dielectric layer 111*a*, and the first electrode layer 121*a*. For example, the through hole may be formed by an etching process such as photo-dry etching (PDE).

Figure 5D:
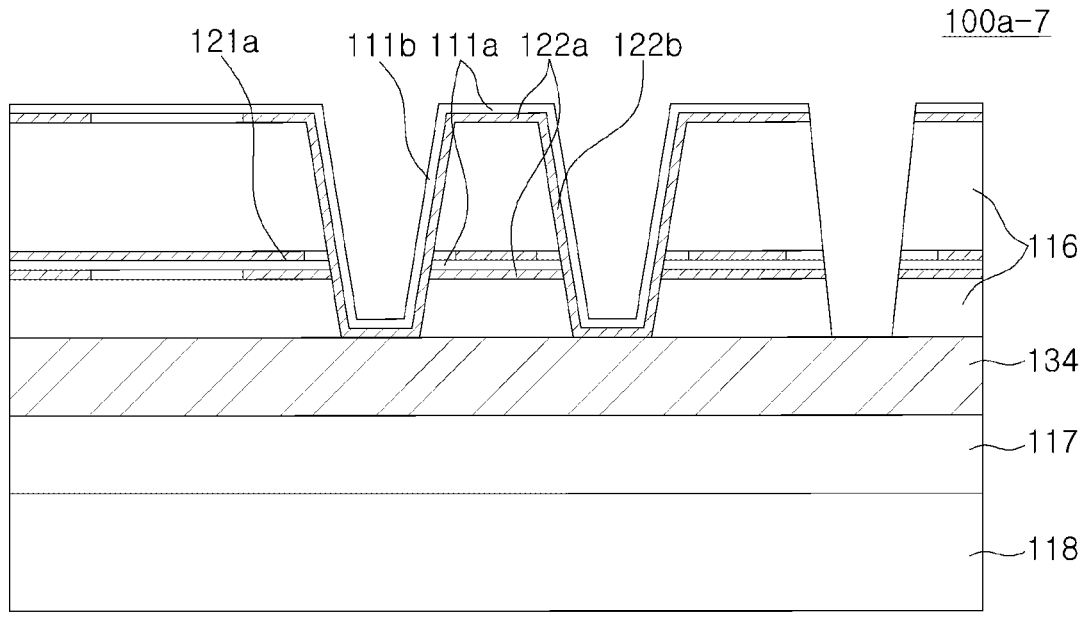
Figure 5D:
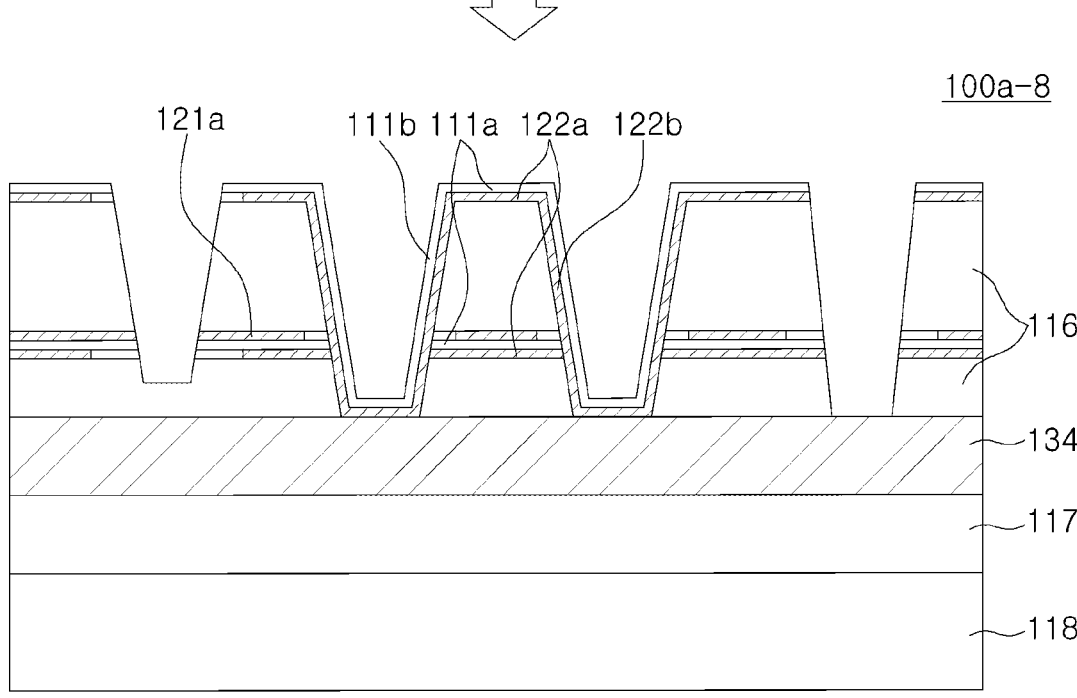

Referring to FIG. 5D, the seventh process 100*a*-7 may include forming a second electrode layer 122*a* and a dielectric layer 111*a* in order on one surface of the insulating layer 116, and forming the through connection portion 122*b* and the dielectric through portion 111*b* in order on one surface of the through hole. The eighth process 100*a*-8 may include additionally forming a through hole.

Figure 5E:
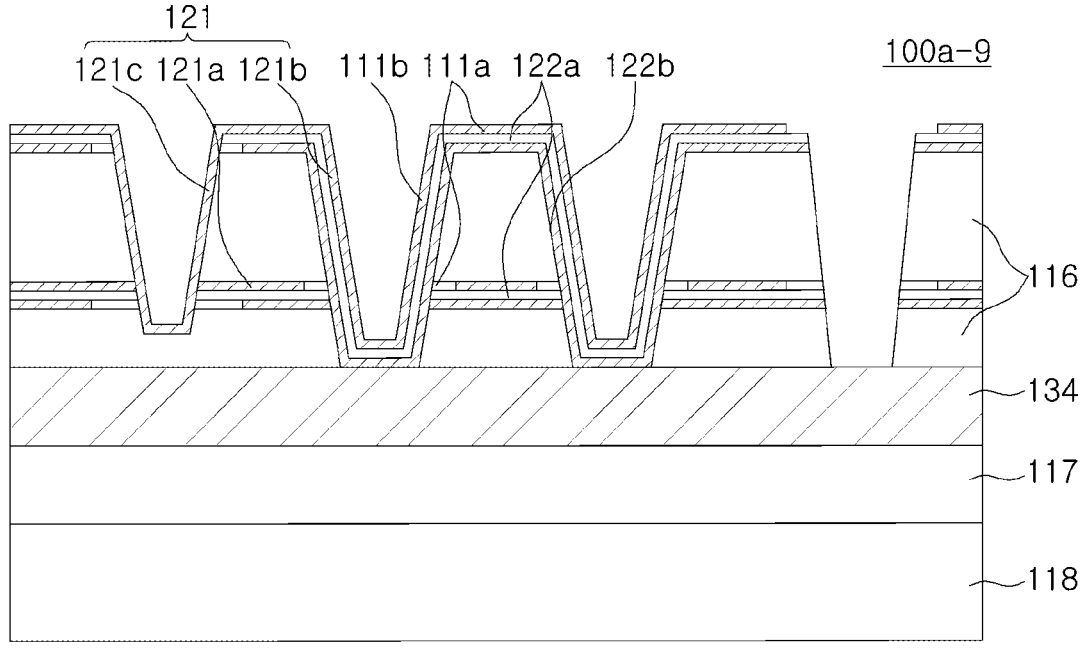
Figure 5E:
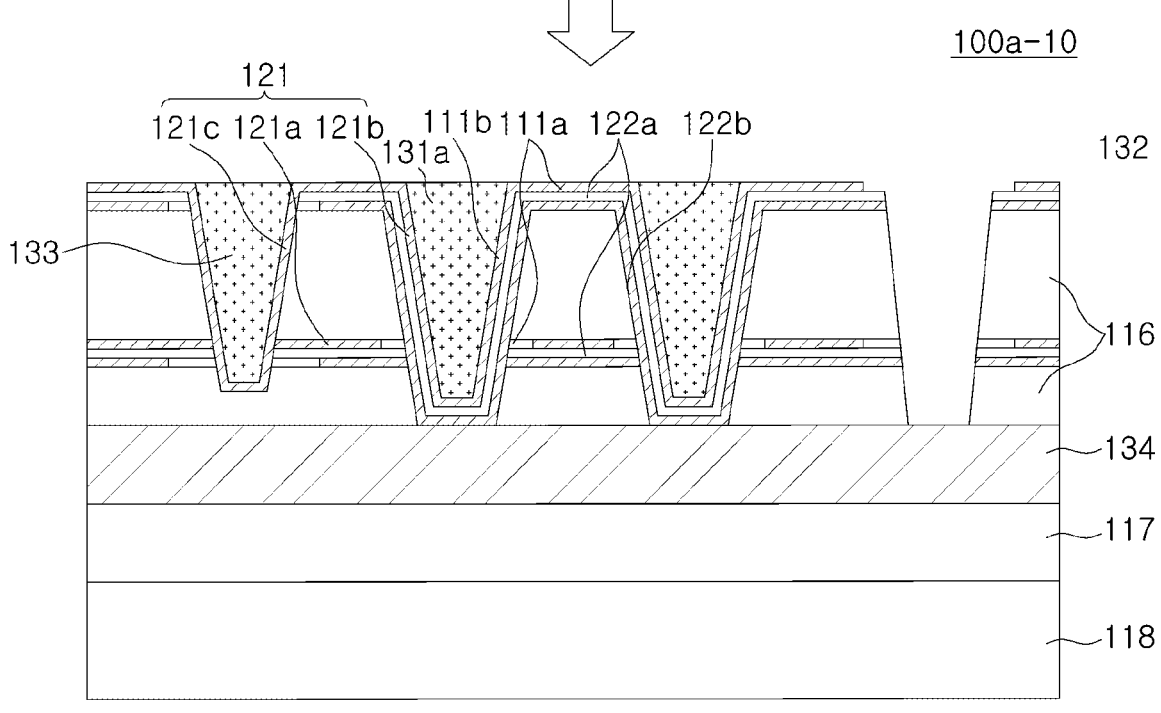

Referring to FIG. 5E, the ninth process 100*a*-9 may include forming the first electrode layer 121*a* on one surface of the dielectric layer 111*a*, and forming a plurality of through extension portions 121*b* and 121*c* on one surface of a plurality of through holes. The tenth process 100*a*-10 may include forming a first conductive pillar 131*a* filled in a plurality of through holes and a connection conductive pillar 133.

Figure 5F:
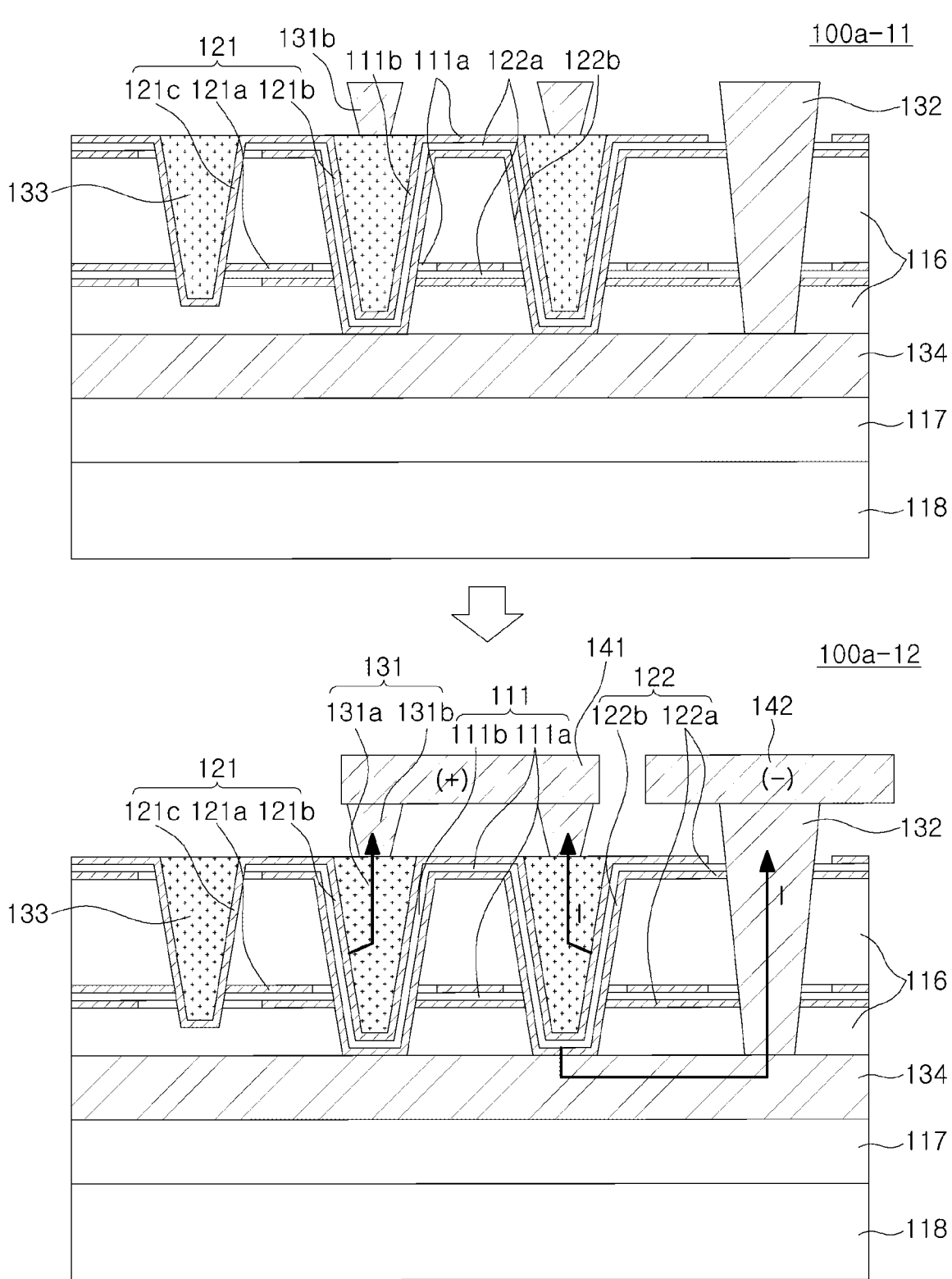

Referring to FIG. 5F, the eleventh process 100*a*-11 may include forming the second conductive pillar 132 in the through hole and forming the first lead-out portion 131*b* on the first conductive pillar 131*a*. The twelfth process 100*a*-12 may include forming the first terminal 141 on one surface of the first lead-out portion 131*b* and the second terminal 142 on the surface of the second conductive pillar 132.

In example embodiments, a process of vertically dicing and dividing the capacitor component undergone the twelfth process 100*a*-12 may also be added. For example, dicing may be mechanical dicing or laser dicing.

Figure 6:
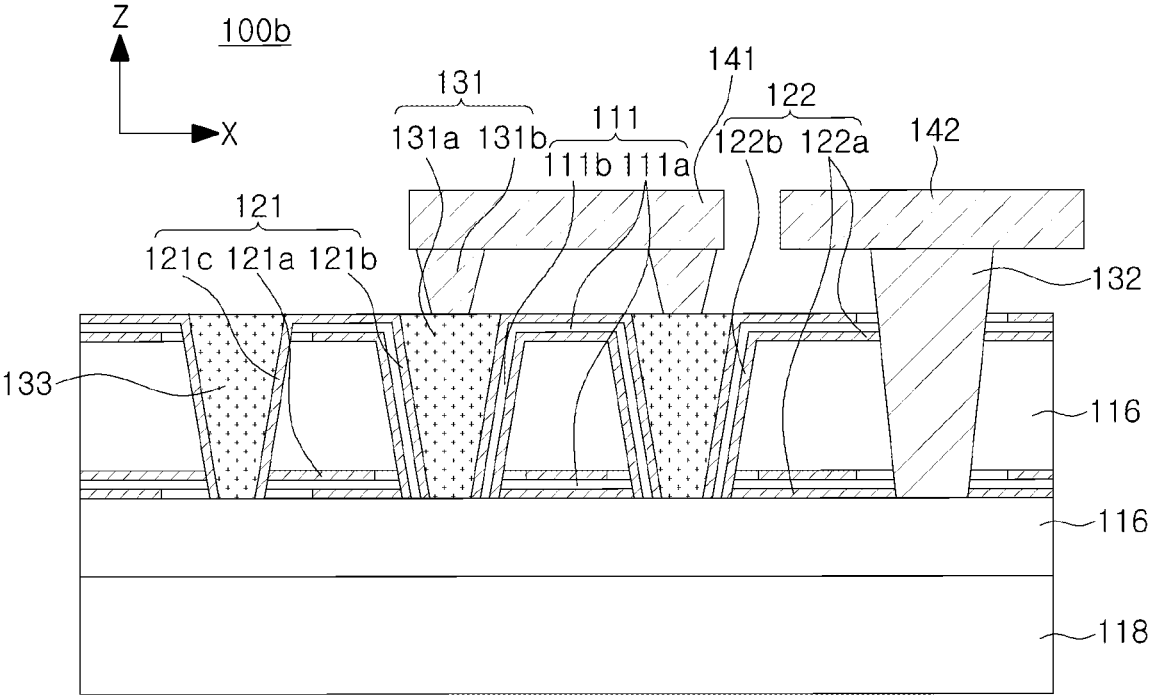
FIG. 6 is a diagram illustrating a structure in which a connection layer and an additional insulating layer of a capacitor component are not provided according to an example embodiment of the present disclosure, viewed laterally.

Referring to FIG. 6, the capacitor component 100*b* in an example embodiment may have a structure in which the connection layer 134 and/or the additional insulating layer 117 in FIG. 1 are not performed. The same components as those of the capacitor component 100*a* in an example embodiment may also be applied to the capacitor component 100*b* in an example embodiment, and thus, redundant descriptions thereof will be omitted.

Figure 7:
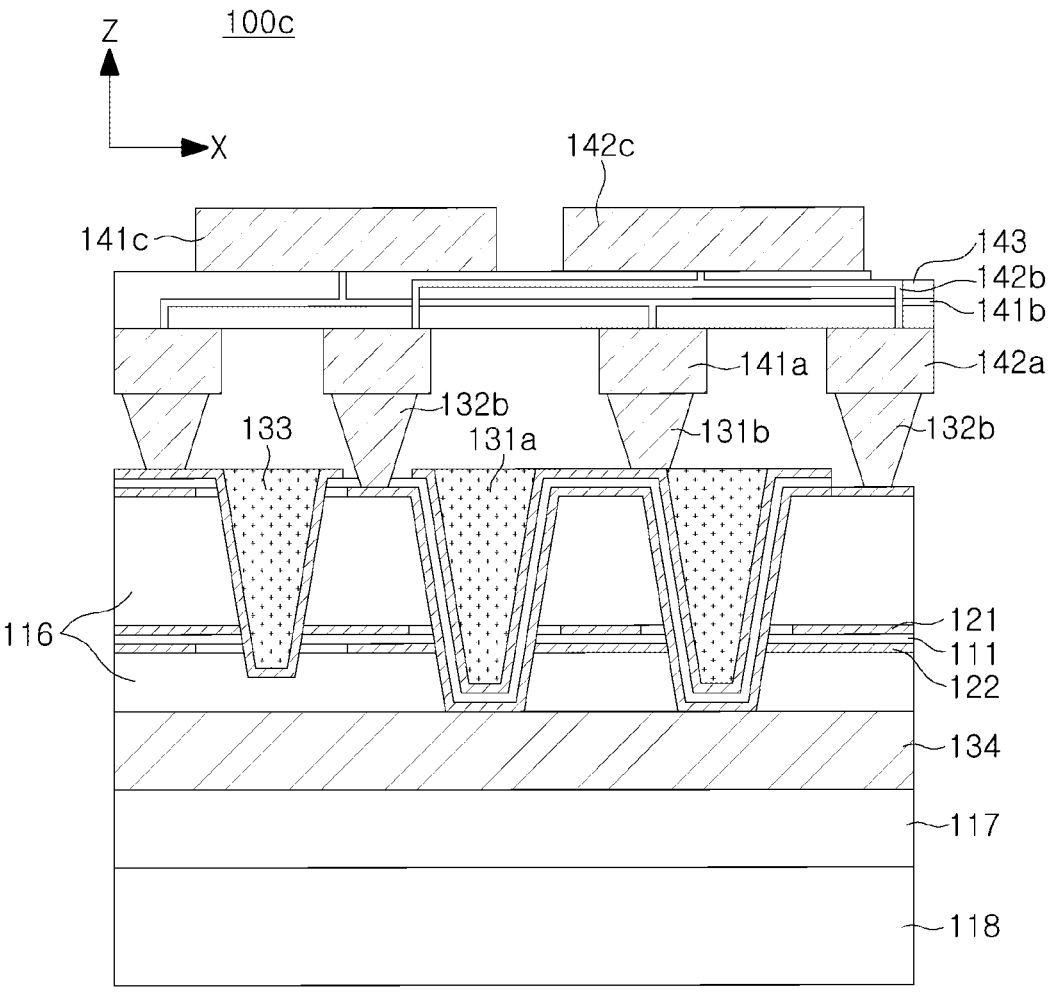
FIG. 7 is a diagram illustrating a structure in which a second conductive pillar of a capacitor component is not provided and an interposer substrate is added according to an example embodiment of the present disclosure, viewed laterally.

Referring to FIG. 7, the capacitor component 100*c* in an example embodiment may have a structure in which the second conductive pillar 132 in FIG. 1 is not provided, and may have a structure further including a second lead-out portion 132*b* instead. The second lead-out portion 132*b* may be electrically connected to the second electrode layer 122*a*, and a portion of the first electrode layer 121*a* and a portion of the dielectric layer 111*a* may be open for electrical connection between the second lead-out portion 132*b* and the second electrode layer 122*a*. Also, the number of each of the first and second lead-out portions 131*b* and 132*b* may be two or more.

Referring to FIG. 7, the capacitor component 100*c* in an example embodiment may include a first wiring 141*b* electrically connected between the first electrode layer 121*a* of the plurality of capacitance laminates and the first terminal 141*c*, and a second wiring 142*b* electrically connected between the second electrode layer 122*a* of the plurality of capacitance laminates and the second terminal 142*c*, and may further include an interposer substrate 143 including an insulating material covering the first and second wirings 141*b* and 142*b*. For example, the interposer substrate 143 may have a further miniaturized structure than a general printed circuit board, and the insulating material may also correspond to an insulating material used in a general printed circuit board. The same components as those of the capacitor component 100*a* in an example embodiment may also be applied to the capacitor component 100*c* in an example embodiment, and thus, redundant descriptions thereof will be omitted.

Figure 8:
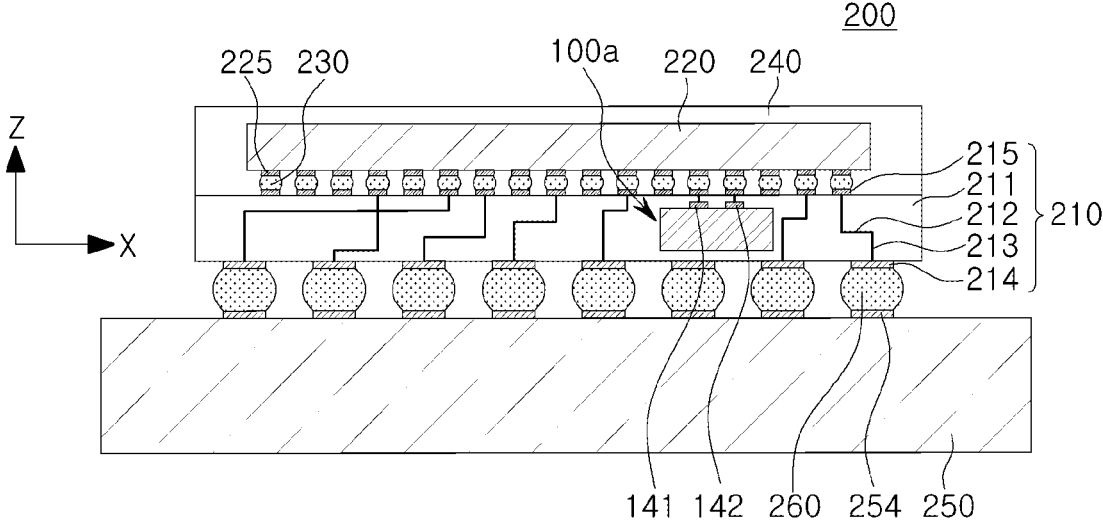
FIG. 8 is a diagram illustrating a semiconductor package according to an example embodiment of the present disclosure, viewed laterally.

Referring to FIG. 8, a semiconductor package 200 according to an example embodiment may include a semiconductor chip 220, a redistribution structure 210, and a capacitor component 100*a*.

The redistribution structure 210 may include a redistribution 212 electrically connected to the semiconductor chip 220. A line width and a pitch of the redistribution 212 may be smaller than a line width and a pitch of a wiring of a general printed circuit board. Accordingly, the redistribution structure 210 may also be smaller than that of a general printed circuit board. For example, the redistribution structure 210 may further include a redistribution insulating layer 211, redistribution vias 213, and redistribution pads 214 and 215, and may correspond to the insulating layer, vias, and pads of the printed circuit board, respectively. For example, the redistribution structure 210 may be implemented according to a wafer level package (WLP) or a panel level package (PLP).

The semiconductor chip 220 may include a logic semiconductor chip and/or a memory semiconductor chip. The logic semiconductor chip may be a microprocessor, for example, a central processing unit (CPU), a graphics processing unit (GPU), a field programmable gate array (FPGA), an application processor (AP), a digital signal processor, a cryptographic processor, a controller, or an application specific integrated circuit (ASIC). The memory semiconductor chip may be a volatile memory such as dynamic random access memory (DRAM) or static random access memory (SRAM) or a non-volatile memory such as flash memory.

For example, the semiconductor chip 220 may be molded by a molding unit 240 such as epoxy molding compound (EMC) and may have a chip pad 225 through which signals or power may be input and output. The semiconductor chip 220 may be mounted on the redistribution structure 210 through the chip bump 230. The redistribution structure 210 may be mounted on the pad 254 on the printed circuit board 250 through the substrate bump 260.

The capacitor component 100*a* in an example embodiment may be electrically connected to the semiconductor chip 220 and may be disposed in the redistribution structure 210. For example, the capacitor component 100*a* may be embedded in the redistribution structure 210 or may be mounted on the lower surface of the redistribution structure 210. For example, since the capacitor component 100*a* may overlap the semiconductor chip 220 in the Z-direction, the capacitor component 100*a* may be used as a land side capacitor (LSC).

Compared to the MLCC, the capacitor component 100*a* may be advantageous to reduce the thickness, and may thus be advantageous to be disposed in the redistribution structure 210. Accordingly, the electrical distance between the capacitor component 100*a* and the semiconductor chip 220 may be shortened, such that the capacitor component 100*a* may be advantageous to improve signal integrity input/ output to the semiconductor chip 220 or to improve power integrity input/output to the semiconductor chip 220.

Also, as an operating frequency of the semiconductor chip 220 increases or the current consumption increases, the capacitor component 100*a* may be, as a decoupling capacitor, be required to have low ESL to increase efficiency of reducing high-frequency noise of the semiconductor chip 220. Since the capacitor component 100a may have a structure advantageous for lowering ESL, high-frequency noise of the semiconductor chip 220 may be effectively reduced.

According to the aforementioned example embodiments, it may be advantageous to lower the ESL or to reduce the thickness as compared to MLCC, and capacitance increase efficiency (which does not refer to relative efficiency with respect to MLCC) may be obtained.

While the example embodiments have been illustrated and described above, it will be configured as apparent to those skilled in the art that modifications and variations could be made without departing from the scope of the present disclosure as defined by the appended claims.

What is claimed is:

1. A capacitor component, comprising:
a support member;
a plurality of capacitance laminates laminated on one surface of the support member;
at least one insulating layer disposed between the plurality of capacitance laminates; and
a plurality of through structures each penetrating through at least one of the plurality of capacitance laminates,
wherein each of the plurality of capacitance laminates includes a first electrode layer, a second electrode layer, and a dielectric layer disposed between the first and second electrode layers,
wherein one of the plurality of through structures includes a connection conductive pillar connected between first electrode layers of the plurality of capacitance laminates,
wherein another of the plurality of through structures includes:
a first conductive pillar connected to a first electrode layer of one of the plurality of capacitance laminates,
a dielectric through portion surrounding the first conductive pillar; and
a through connection portion surrounding the dielectric through portion and connecting second electrode layers of the plurality of capacitance laminates to each other.

2. The capacitor component of claim 1,
wherein each of the first conductive pillar and the connection conductive pillar includes TiN, and
wherein a dielectric layer of each of the plurality of capacitance laminates includes at least one of $SiO_2$, $Si_3N_4$, $Al_2O_3$, $AlO_2$, $ZrO_2$, $HfO_2$, $Nb_2O_5$, $CeO_2$ and $TiO_2$.

3. The capacitor component of claim 1,
wherein the at least one insulating layer includes a plurality of insulating layers spaced apart from each other by the plurality of capacitance laminates, and
wherein the first conductive pillar penetrates at least one of the plurality of insulating layers.

4. The capacitor component of claim 3, wherein a thickness of each of the plurality of insulating layers is greater than a thickness of each of the plurality of capacitance laminates.

5. The capacitor component of claim 1,
wherein the first conductive pillar includes a plurality of first conductive pillars each penetrating through at least one of the plurality of capacitance laminates, and
wherein the number of the plurality of first conductive pillars is greater than the number of connection conductive pillars.

6. The capacitor component of claim 1, further comprising:
a plurality of through extension portions extending from a first electrode layer of one of the plurality of capacitance laminates, surrounding the connection conductive pillar, and surrounding the first conductive pillar,
wherein one of the plurality of through extension portions connects first electrode layers of the plurality of capacitance laminates to each other, and
wherein another of the plurality of through extension portions is surrounded by the dielectric through portion.

7. The capacitor component of claim 1, further comprising:
a first terminal connected to a first electrode layer of the plurality of capacitance laminates;
a second terminal connected to a second electrode layer of the plurality of capacitance laminates; and
an interposer substrate including a first wiring connected between the first electrode layer of the plurality of capacitance laminates and the first terminal, a second wiring connected between a second electrode layer of the plurality of capacitance laminates and the second terminal, and an insulating material covering the first and second wirings.

8. The capacitor component of claim 1, further comprising:
a first terminal connected to a first electrode layer of the plurality of capacitance laminates; and
a first lead-out portion connected between a first electrode layer of the plurality of capacitance laminates and the first terminal and having higher conductivity than those of the first conductive pillar and the connection conductive pillar.

9. The capacitor component of claim 8, wherein the first lead-out portion is disposed to overlap the first conductive pillar in a penetration direction of the first conductive pillar.

10. The capacitor component of claim 9, further comprising:
a second terminal connected to the second electrode layer of the plurality of capacitance laminates; and
a second conductive pillar penetrating through at least one of the plurality of capacitance laminates and connected between second electrode layers of the plurality of capacitance laminates,
wherein the second conductive pillar is connected to the second terminal and has a height higher than the first conductive pillar.

11. The capacitor component of claim 1, further comprising:
a second conductive pillar penetrating through at least one of the plurality of capacitance laminates and connected between second electrode layers of the plurality of capacitance laminates.

12. The capacitor component of claim 11, further comprising:
a connection layer disposed between the support member and a capacitance laminate most adjacent to the support member among the plurality of capacitance laminates,
wherein the connection layer is connected between the through connection portion and the second conductive pillar.

13. The capacitor component of claim 12, wherein conductivity of the first conductive pillar is lower than that of the second conductive pillar and lower than that of the connection layer.

14. The capacitor component of claim 13, wherein the first conductive pillar includes TiN, and wherein each of the second conductive pillar and the connection layer includes copper (Cu).

15. The capacitor component of claim 12, further comprising:

an additional insulating layer disposed between the connection layer and the support member, wherein the additional insulating layer includes $SiO_2$, and wherein the at least one insulating layer includes $SiO_2$.

16. The capacitor component of claim 1, wherein the support member includes at least a portion of a silicon wafer.

17. A semiconductor package, comprising:

a semiconductor chip;

a redistribution structure including a redistribution connected to the semiconductor chip; and the capacitor component of claim 1 connected to the semiconductor chip and disposed on the redistribution structure.

18. A capacitor component, comprising:

a support member;

a first capacitance region disposed on the support member and including a first electrode layer, a first dielectric layer, and a second electrode layer;

a second capacitance region disposed on the support member to at least partially overlap with the first capacitance region in a thickness direction of the support member, and including a third electrode layer, a second dielectric layer, and a fourth electrode layer;

an insulating layer disposed between the second electrode layer and the third electrode layer;

first and second through structures each penetrating through the insulating layer;

a first extension portion disposed in the first through structure to connect the first electrode layer and the third electrode layer to each other; and a second extension portion disposed in the second through structure to connect the second electrode layer and the fourth electrode layer to each other.

19. The capacitor component of claim 18, further comprising:

a third extension portion disposed in the second through structure to connect to the first electrode layer; and a third dielectric layer disposed between the second extension portion and the third extension potion, and connected to the first dielectric layer.

20. The capacitor component of claim 19, further comprising:

a first conductive pillar disposed in the first through structure to connect to the first extension portion; and a second conductive pillar disposed in the second through structure to connect to the third extension portion.

21. The capacitor component of claim 19, further comprising:

a third capacitance region disposed on the support member and including a fifth electrode layer, a fourth dielectric layer, and a sixth electrode layer;

a fourth capacitance region disposed on the support member to at least partially overlap with the third capacitance region in the thickness direction of the support member, and including a seventh electrode layer, a fifth dielectric layer, and an eighth electrode layer;

wherein the insulating layer is disposed between the sixth electrode layer and the seventh electrode layer, the second extension layer is connected to the sixth electrode layer and the eighth electrode layer, and the third extension layer is connected to the fifth electrode layer.

22. The capacitor component of claim 18, wherein the first extension portion is spaced apart from the second electrode layer and the fourth electrode layer, and wherein the second extension portion is spaced apart from the third electrode layer.

23. The capacitor component of claim 18, wherein in the thickness direction of the support member, a thickness of the insulating layer is greater than a thickness of each of the first capacitance region and the second capacitance region.

24. The capacitor component of claim 18, further comprising:

a first terminal connected to the first electrode layer; and a second terminal connected to the fourth electrode layer.

25. The capacitor component of claim 24, further comprising:

a first lead-out portion connected to the first terminal and disposed on the second through structure to connect to the first electrode layer; and a second lead-out portion connected to the second terminal and penetrating at least into the insulating layer to connect to the fourth electrode layer.

* * * * *